(12) United States Patent
Zhang et al.

(10) Patent No.: US 9,130,131 B2
(45) Date of Patent: Sep. 8, 2015

(54) GARNET-BASED PHOSPHOR CERAMIC SHEETS FOR LIGHT EMITTING DEVICE

(71) Applicant: NITTO DENKO CORPORATION, Osaka (JP)

(72) Inventors: Bin Zhang, San Diego, CA (US); Rajesh Mukherjee, Irvine, CA (US); Hironaka Fujii, Carlsbad, CA (US); Hiroaki Miyagawa, Oceanside, CA (US); Guang Pan, Carlsbad, CA (US); Toshitaka Nakamura, Osaka (JP); Amane Mochizuki, Carlsbad, CA (US)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 13/958,244

(22) Filed: Aug. 2, 2013

(65) Prior Publication Data

US 2013/0313967 A1    Nov. 28, 2013

Related U.S. Application Data

(63) Continuation of application No. 13/050,746, filed on Mar. 17, 2011, now abandoned.

(60) Provisional application No. 61/315,763, filed on Mar. 19, 2010.

(51) Int. Cl.
*H01L 33/50* (2010.01)
*B32B 18/00* (2006.01)
(Continued)

(52) U.S. Cl.
CPC ............... *H01L 33/504* (2013.01); *B32B 18/00* (2013.01); *C04B 35/22* (2013.01); *C04B 35/44* (2013.01);
(Continued)

(58) Field of Classification Search
CPC ...... H01L 33/502; H01L 33/50; H01L 33/501
USPC .................................. 313/498–512
See application file for complete search history.

(56) References Cited

U.S. PATENT DOCUMENTS 5,998,925 A    12/1999  Shimizu et al.
6,069,440 A     5/2000  Shimizu et al.
(Continued)

FOREIGN PATENT DOCUMENTS

CN    101 181 798    5/2008
EP      0 936 682    8/1999
(Continued)

OTHER PUBLICATIONS

Kasuya et al., "Characteristic Optical Properties of Transparent Color Conversion Film Prepared from YAG:Ce3+ Nanoparticles", Applied Physics Letters, Sep. 14, 2007, vol. 91, No. 11, pp. 111916-111916.
(Continued)

*Primary Examiner* — Anne Hines
(74) *Attorney, Agent, or Firm* — Knobbe, Martens, Olson & Bear, LLP (57) ABSTRACT

Some embodiments disclosed herein include a lighting apparatus having a composite. The composite may include a first emissive layer and a second emissive layer. The first emissive layer may include a first garnet phosphor having a common dopant. The second emissive layer may include a second garnet phosphor having the common dopant. In some embodiments, the first emissive layer and the second emissive layer are fixed together. Some embodiments disclosed herein include efficient and economic methods of making the composite. The method may include, in some embodiments, sintering an assembly that includes pre-cursor materials for the first emissive layer and the second emissive layer.

21 Claims, 5 Drawing Sheets

(51) Int. Cl.

| | | |
|---|---|---|
| *C04B 35/22* | (2006.01) | |
| *C04B 35/44* | (2006.01) | |
| *C04B 35/626* | (2006.01) | |
| *C04B 35/634* | (2006.01) | |
| *C04B 35/638* | (2006.01) | |
| *C09K 11/77* | (2006.01) | |

(52) U.S. Cl.
CPC ......... *C04B 35/62665* (2013.01); *C04B 35/638* (2013.01); *C04B 35/6342* (2013.01); *C04B 35/6344* (2013.01); *C04B 35/63416* (2013.01); *C04B 35/63488* (2013.01); *C09K 11/7774* (2013.01); *C04B 2235/3206* (2013.01); *C04B 2235/3208* (2013.01); *C04B 2235/3224* (2013.01); *C04B 2235/3225* (2013.01); *C04B 2235/3227* (2013.01); *C04B 2235/3229* (2013.01); *C04B 2235/3418* (2013.01); *C04B 2235/604* (2013.01); *C04B 2235/6562* (2013.01); *C04B 2235/6565* (2013.01); *C04B 2235/6567* (2013.01); *C04B 2235/6581* (2013.01); *C04B 2235/6587* (2013.01); *C04B 2235/661* (2013.01); *C04B 2235/663* (2013.01); *C04B 2235/9661* (2013.01); *C04B 2237/341* (2013.01); *C04B 2237/343* (2013.01); *H01L 33/507* (2013.01)

(56) References Cited

U.S. PATENT DOCUMENTS

| | | |
|---|---|---|
| 6,844,285 B1 | 1/2005 | Wei |
| 7,250,715 B2 | 7/2007 | Mueller et al. |
| 7,361,938 B2 | 4/2008 | Mueller et al. |
| 7,446,343 B2 | 11/2008 | Mueller et al. |
| 7,514,721 B2 | 4/2009 | Krames et al. |
| 7,554,258 B2 | 6/2009 | Rossner et al. |
| 7,799,267 B2 | 9/2010 | Messing et al. |
| 8,828,531 B2 | 9/2014 | Pan et al. |
| 8,922,111 B2 | 12/2014 | Zhang et al. |
| 2004/0145308 A1 | 7/2004 | Rossner et al. |
| 2004/0256974 A1 | 12/2004 | Mueller-Mach et al. |
| 2005/0137078 A1 | 6/2005 | Anderson et al. |
| 2005/0269582 A1 | 12/2005 | Mueller et al. |
| 2006/0267500 A1 | 11/2006 | Chau et al. |
| 2006/0284196 A1* | 12/2006 | Setlur et al. ............ 257/98 |
| 2007/0126017 A1 | 6/2007 | Krames et al. |
| 2007/0176539 A1 | 8/2007 | Mathai et al. |
| 2007/0215890 A1* | 9/2007 | Harbers et al. ............ 257/98 |
| 2007/0257597 A1 | 11/2007 | Sakata et al. |
| 2007/0263969 A1 | 11/2007 | Huang et al. |
| 2008/0211389 A1* | 9/2008 | Oshio ............ 313/503 |
| 2009/0002810 A1 | 1/2009 | Jeon et al. |
| 2009/0108507 A1 | 4/2009 | Messing et al. |
| 2009/0212697 A1* | 8/2009 | Nakamura et al. ............ 313/506 |
| 2010/0012964 A1 | 1/2010 | Copic et al. |
| 2010/0067214 A1 | 3/2010 | Hoelen et al. |
| 2010/0276717 A1 | 11/2010 | Boerkekamp et al. |
| 2011/0116263 A1 | 5/2011 | Cillessen et al. |
| 2011/0227477 A1 | 9/2011 | Zhang et al. |
| 2012/0001214 A1 | 1/2012 | Ooyabu et al. |
| 2012/0068213 A1 | 3/2012 | Zhang et al. |
| 2012/0141771 A1 | 6/2012 | Pan et al. |
| 2014/0332722 A1 | 11/2014 | Pan et al. |

FOREIGN PATENT DOCUMENTS

| | | |
|---|---|---|
| EP | 1 139 440 | 10/2001 |
| EP | 1 278 250 | 1/2003 |
| EP | 1 473 784 | 11/2004 |
| JP | 2002-060747 | 2/2002 |
| JP | 2007-150331 | 6/2007 |
| JP | 2009-177106 | 8/2009 |
| JP | 2011-256371 | 12/2011 |
| WO | WO 2007/062136 | 5/2007 |
| WO | WO 2007/107917 | 9/2007 |
| WO | WO 2008/056292 | 5/2008 |
| WO | WO 2008/149256 | 12/2008 |
| WO | WO 2008149256 A1 * | 12/2008 |
| WO | WO 2009/038674 | 3/2009 |
| WO | WO 2010/010484 | 1/2010 |
| WO | WO 2011/097137 | 8/2011 |
| WO | WO 2011/115820 | 9/2011 |
| WO | WO 2012/040046 | 3/2012 |
| WO | WO 2012/075018 | 6/2012 |
| WO | WO 2013/134163 | 8/2013 |

OTHER PUBLICATIONS

Ohkubo et al, "Absolute Fluorescent Quantum Efficiency of NBS Phosphor Standard Samples", Journal of the Illuminating Engineering Institute of Japan, 1999, vol. 83, No. 2, pp. 87-93.

Yagi et al., "Characterizations and Laser Performances of Highly Transparent Nd3+:Y3Al5O12 Laser Ceramics", Optical Materials, 2007, vol. 29, pp. 1258-1262.

International Search Report and Written Opinion in PCT Application No. PCT/US2011/027990, dated Jul. 21, 2011.

* cited by examiner

GARNET-BASED PHOSPHOR CERAMIC SHEETS FOR LIGHT EMITTING DEVICE

CROSS-REFERENCE TO RELATED APPLICATIONS

This application is a continuation of U.S. patent application Ser. No. 13/050,746 filed Mar. 17, 2011, which claims the benefit of priority to U.S. Provisional Application No. 61/315,763, filed Mar. 19, 2010. All of the foregoing applications are fully incorporated herein by reference for all purposes.

BACKGROUND

1. Field

The present application relates to a lighting apparatus including a translucent composite of garnet-based emissive layers.

2. Description

Solid state light emitting devices such as light emitting diode (LED), organic light emitting diode (OLED) or sometimes called organic electroluminescent device (OEL), and inorganic electroluminescent device (IEL) have been widely utilized for various applications such as flat panel display, indicator for various instrument, signboard, and ornamental illumination, etc. As the emission efficiency of these light emitting devices continues to improve, applications that require much higher luminance intensity, such as automobile headlights and general lighting, may soon become feasible. For these applications, white-LED is one of the promising candidates and have attracted much attention.

Conventional white-LED have been manufactured based on the combination of blue-LED and yellow light-emitting YAG phosphor powder dispersed in plastic encapsulant resin like epoxy and silicone. However, since the particle size of YAG phosphor powder utilized for this system is around 1-10 µm, the YAG powders dispersed in the encapsulant resin medium can cause strong light scattering. As a result, a considerable portion of both the incident light from the blue LED and the yellow emitting light from YAG powders ends up being back scattered and dissipated as a loss of white light emission.

One approach to solve this problem is to use one or more phosphor ceramic plates or laminated films that are positioned to receive emissions from blue emitting light emitting diodes instead of phosphor powders suspended in a transparent matrix. With optimized sintering conditions, combined with the use of phosphors in nanoparticle form, it is possible to obtain a translucent or transparent ceramic. Since an LED with translucent/transparent phosphor ceramics has less backscattering loss while maintaining, or in some cases, increasing the luminance efficiency of the phosphor layer, it may emit stronger white light than conventional YAG powder/resin system. In addition, since a ceramic plate/film is more stable against heat and light irradiation even under UV, temperature fluctuation of operational property, durability, and lifetime of the LED can be improved.

In order to achieve a lower correlated color temperature (CCT) and higher color rendering index (CRI) in a YAG: Ce LED system, a red emitting component is needed. U.S. Patent Publication No. 2007/0215890, which is hereby incorporated by reference in its entirety, discloses the use of a red phosphor platelet and a green phosphor platelet in combination with a blue LED to create a white light LED. U.S. Pat. No. 7,446,343, which is hereby incorporated by reference in its entirety, uses yellow and red phosphor layers in LEDs, where the red phosphor candidates need to have $Eu^{3+}$ as dopant. Due to the use of different dopants for the yellow and the red layers, they have to be prepared separately. Furthermore, since $Eu^{3+}$-doped compounds have a primary absorption region in the UV spectra instead of the blue visible light, some have resorted to using nitride or sulfide phosphors that can be activated by blue light. For example, U.S. Pat. No. 7,361,938, which is hereby incorporated by reference in its entirety, discloses the use of a yellow emitting garnet (YAG: Ce) phosphor and a red emitting nitride or sulphide phosphor. However, these nitride or sulfide emissive elements are not desirable due to the processing difficulties and/or chemical/thermal stability concerns. Thus there is a need for a white light LED device that utilizes blue light and green/yellow/red phosphor layers and offers simplified processing.

Furthermore, some lighting systems, particularly those for daily and landscape uses, as well as high power lighting systems for industrial uses, have a somewhat lower color temperature, $T \leq 3500K$, falling into the category of warm white lighting. If the color temperature is higher, $T > 4600K$, the lighting system will be categorized as cold white light. For solid-state lighting purposes, warm white light is especially preferred because it has the same color temperature as standard incandescent bulbs. Thus, there is also a need for warm white light LED devices that utilize blue light and green/yellow/red phosphor layers, as well as simple and economical processes for making these LED devices.

SUMMARY

Some embodiments disclosed herein provide a lighting apparatus comprising a light source configured to emit radiation having a wavelength of peak emission between about 360 nm and about 500 nm; and a composite configured to receive at least a portion of the radiation emitted by the light source, wherein the composite comprises a first emissive layer and a second emissive layer; wherein the first emissive layer comprises a first garnet phosphor and the second emissive layer comprises a second garnet phosphor, and the first garnet phosphor and the second garnet phosphor are doped with a common dopant.

In some embodiments, the second emissive layer is disposed between the first emissive layer and the light source. In some embodiments, the composite is substantially free of resin between the first emissive layer and the second emissive layer.

In some embodiments, the first emissive layer and the second emissive layer are sintered together. In some embodiments, the composite is substantially free of an adhesive between the first emissive layer and the second emissive layer. In some embodiments, each of the first emissive layer and the second emissive layer has an at least 25% transmittance.

In some embodiments, the first garnet phosphor has a first wavelength of peak emission between about 495 nm and about 560 nm. In some embodiments, the second garnet phosphor has a second wavelength of peak emission between about 570 nm and about 650 nm.

In some embodiments, the first garnet phosphor is doped with the common dopant at a concentration in the range of about 0.05% to about 10.00% by mol. In some embodiments, the second garnet phosphor is doped with the common dopant at a concentration in the range of about 0.05% to about 10.00% by mol.

In some embodiments, the common dopant is selected from the group consisting of Nd, Er, Eu, Cr, Yb, Sm, Tb, Ce and Pr.

In some embodiments, the first garnet phosphor is selected from the group consisting of $Lu_3Al_5O_{12}$:Ce, $Ca_3Sc_2Si_3O_{12}$:Ce, $Y_3Al_5O_{12}$:Ce, $(Y,Tb)_3Al_5O_{12}$:Ce and $(Y, Gd)_3(Al, Ga)_5O_{12}$:Ce. In some embodiments, the second garnet phosphor is $Lu_2CaMg_2Si_3O_{12}$:Ce. In some embodiments, the first garnet phosphor is $Lu_3Al_5O_{12}$:Ce, and the second garnet phosphor is $Y_3Al_5O_{12}$:Ce.

In some embodiments, the first emissive layer and the second emissive layer are ceramic plates or laminated ceramic tapes.

In some embodiments, the composite further comprises a third emissive layer, wherein the third emissive layer comprises a third garnet phosphor having a third wavelength of peak emission. In some embodiments, the third wavelength of peak emission is between about 495 nm and about 540 nm, the first wavelength of peak emission is between about 540 and about 590 nm, and the second wavelength of peak emission is between 570 nm and about 650 nm. In some embodiments, the first emissive layer is disposed between the third emissive layer and the second emissive layer.

In some embodiments, the first garnet phosphor is selected from the group consisting of $Lu_3Al_5O_{12}$:Ce and $Ca_3Sc_2Si_3O_{12}$:Ce, and the third garnet phosphor is selected from the group consisting of $Y_3Al_5O_{12}$:Ce, $(Y,Tb)_3Al_5O_{12}$:Ce. and $(Y, Gd)_3(Al, Ga)_5O_{12}$:Ce.

In some embodiments, the second garnet phosphor is $Lu_2CaMg_2Si_3O_{12}$:Ce.

In some embodiments, the first emissive layer, the second emissive layer and the third emissive layer are ceramic plates or laminated ceramic tapes.

In some embodiments, the composite further comprises a first non-emissive layer disposed between the first emissive layer and the second emissive layer, wherein the first non-emissive layer is substantially transparent. In some embodiments, the first non-emissive layer is a ceramic. In some embodiments, the non-emissive layer consists essentially of a garnet material. In some embodiments, the non-emissive layer is substantially free of dopant. In some embodiments, the first non-emissive layer is substantially impermeable to diffusion of the common dopant.

In some embodiments, the composite further comprises a second non-emissive layer disposed between the first emissive layer and the third emissive layer, wherein the second non-emissive layer is substantially transparent.

In some embodiments, each of the first emissive layer, the second emissive layer and the third emissive layer has an at least 25% transmittance.

In some embodiments, the wavelength of peak emission of the light source is between about 450 nm to about 500 nm.

Some embodiments provide a method of making a composite comprising providing an assembly comprising a first layer and a second layer, wherein the first layer comprises a first doped garnet phosphor, and the second layer comprises a second doped garnet phosphor, wherein the first doped garnet phosphor and the second doped garnet phosphor have a common dopant; and sintering the assembly to produce the composite.

In some embodiments, the method does not include applying an adhesive or a resin between the first layer and the second layer after sintering the assembly.

In some embodiments, providing the assembly comprises: providing a first mixture comprising a first garnet phosphor in a solvent and a second mixture comprising a second garnet phosphor in the solvent; forming at least one first tape comprising the first garnet phosphor by casting the first mixture on a first substrate and allowing the solvent to evaporate; forming at least one second tape comprising the second garnet phosphor by casting the second mixture on a second substrate and allowing the solvent to evaporate; stacking the at least one first tape and the at least one second tape together to form a tape stack; and compressing and heating the tape stack to form the assembly.

In some embodiments, the method further comprises forming at least one non-emissive tape, and disposing the at least one non-emissive tape between the at least one first tape and the at least one second tape.

In some embodiments, the at least one non-emissive tape consists essentially of a garnet material.

DETAILED DESCRIPTION

Disclosed herein are lighting apparatuses having a composite comprising two or more emissive layers, each emissive layer having a garnet phosphor doped with a common dopant. Applicants have discovered that using a common dopant within the composite provides superior absorption efficiency. In particular, the absorption efficiency is improved at the excitation wavelength ranging from 360 nm to about 500 nm (preferably about 460 nm). Additionally, by using garnet materials for each emissive layer, the composite exhibits superior transparency, and reduced cracking or warping during heating or cooling.

Also disclosed are efficient and economic processes for making the garnet phosphors. Conventional methods for making a composite with multiple emissive layers require sintering each layer under separate conditions and subsequently stacking the emissive layers to form a composite. Some embodiments disclosed herein provide for sintering the composite in a single step to reduce the cost and time necessary to prepare the composite. The composite can be sintered in a single step, in part, because the similar garnet materials allow sintering under the same conditions. Furthermore, the common dopant among each layer reduces dopant diffusion problem during the sintering step, and eliminates the need to sinter each layer separately. These and other advantages may be obtained through the teachings of the present application.

Lighting Apparatus

Some embodiments provide a lighting apparatus having a light source and a composite configured to receive at least a portion of the radiation emitted by the light source. The composite comprises a first emissive layer and a second emissive layer. The first emissive layer comprises a first garnet phosphor, and the second emissive layer comprises a second garnet phosphor, and the first garnet phosphor and the second garnet phosphor are doped with a common dopant.

The light source may, in some embodiments, be configured to emit radiation having a wavelength of peak emission between about 360 nm and about 500 nm. In some embodiments, the light source emits radiation having a wavelength of peak emission between about 450 nm and about 500 nm. Some embodiments include a light source that is a semiconductor LED. As an example, the light source may be an AlInGaN based single crystal semiconductor material coupled to an electric source.

The first emissive layer comprises a first garnet phosphor doped with a dopant that is the same as the dopant in the second emissive layer. Thus the first and the second phosphors are doped with a common dopant. The garnet phosphor may have a composition $D_3E_5O_{12}$. In some embodiments, D and E are independently selected from trivalent metals. In other embodiments, D can be selected from Lu, Y, Gd, La, and Tb; and E can be selected from Al, Ga, and In. In preferred embodiments, D is selected from Lu and Y, and E is Al. The common dopant may be selected from Nd, Er, Eu, Cr, Yb, Sm, Tb, Ce and Pr. In some embodiments, the common dopant is Ce.

The first garnet phosphor may include a concentration of common dopant that is effective for the first garnet phosphor to exhibit fluorescence when exposed to radiation having a wavelength of peak emission in the range of about 360 nm to about 500 nm. In some embodiments, the common dopant has a concentration in the first garnet phosphor ranging from about 0.05 mol % to about 2 mol %. In some embodiments, the dopant concentration in the first garnet phosphor may be from about 0.01 mol % to about 5 mol %, about 0.05 mol % to about 3 mol %, about 0.1 mol % to about 1 mol %. Non-limiting examples of garnets include $Y_3Al_5O_{12}$:Ce, $(Y, Tb)_3Al_5O_{12}$:Ce, $(Y, Gd)_3(Al, Ga)_5O_{12}$:Ce, $Lu_3Al_5O_{12}$:Ce, and $Ca_3Sc_2Si_3O_{12}$:Ce. In some embodiments, the first garnet phosphor is selected from $Lu_3Al_5O_{12}$:Ce and $Ca_3Sc_2Si_3O_{12}$:Ce. In some embodiments, the first garnet phosphor is $Lu_3Al_5O_{12}$:Ce, and the second garnet phosphor is $Y_3Al_5O_{12}$:Ce.

The first garnet phosphor can be selected to adjust the emitted light from the lighting apparatus. For example, the first garnet phosphor can be selected to emit yellow or green light when exposed to the light source. A green emission can be obtained by selecting $Lu_3Al_5O_{12}$:Ce and/or $Ca_3Sc_2Si_3O_{12}$:Ce, while a yellow emission can be obtained by selecting $Y_3Al_5O_{12}$:Ce and/or $(Y, Gd)_3(Al, Ga)_5O_{12}$:Ce. In some embodiments, the first garnet phosphor has a first wavelength of peak emission between about 495 nm to about 590 nm. For example, the first wavelength of peak emission may be between about 495 nm to about 540 nm, or alternatively the first wavelength of peak emission may be between about 540 nm to about 590 nm The second emissive layer may include a second garnet phosphor. The second garnet phosphor may be a garnet doped with a common dopant (i.e., the same dopant that is also present in the first garnet phosphor). The garnet may be, for example, any of those materials described above with respect to the first garnet phosphor. Thus, for example, the garnet may have a composition $D_3E_5O_{12}$, where D and E are trivalent metals. The second garnet phosphor may include a concentration of common dopant that is effective for the second garnet phosphor to exhibit fluorescence when exposed to radiation having a wavelength of peak emission in the range of about 360 nm to about 500 nm. The second garnet phosphor may also include a common dopant having a concentration ranging from about 0.05 mol % to about 10.0 mol %. In some embodiments, the dopant concentration in the second garnet phosphor may be from about 0.1 mol % to about 7.5 mol %, about 0.25 mol % to about 5 mol %, about 0.5 mol % to about 3 mol % or about 0.75 mol % to about 2 mol %. In a preferred embodiment, the second phosphor is $Lu_2CaMg_2Si_3O_{12}$:Ce.

The second garnet phosphor may also be selected to adjust the emitted light from the lighting apparatus. In some embodiments, the second garnet phosphor has a second wavelength of peak emission between about 570 nm and about 650 nm. In some embodiments, the first wavelength of peak emission and the second wavelength of peak emission are substantially different (e.g., the wavelengths are at least about 10 nm apart).

The first garnet phosphor and the second garnet phosphor can be different garnets. For example, the first garnet phosphor is $Y_3Al_5O_{12}$:Ce and the second garnet phosphor is $Lu_2CaMg_2Si_3O_{12}$:Ce. In some embodiments, the emission profile of the second garnet phosphor is substantially different from the emission profile of the first garnet phosphor when both phosphors are exposed to radiation having a wavelength of peak emission in the range of about 360 nm to about 500 nm. In some embodiments, the first phosphor exhibits a wavelength of peak emission that is at least about 10 nm apart from any wavelength of peak emission exhibited by the second phosphor. In some embodiments, the second garnet phosphor is free of at least one garnet that is present in the first garnet phosphor. As an example, the first garnet phosphor includes $Y_3Al_5O_{12}$:Ce and the second garnet phosphor has no more than trace amounts of $Y_3Al_5O_{12}$:Ce. In some embodiments, the concentration of common dopant is substantially different for the first garnet phosphor and the second garnet phosphor. For example, the difference in dopant concentration between the first garnet phosphor and the second garnet phosphor is at least 0.1 mol %, or preferably at least 0.5 mol %.

Some embodiments have a composite with a third emissive layer comprising a third garnet phosphor. The garnet phosphor may be a garnet doped with a common dopant (i.e., a dopant also present in the first garnet phosphor and the second garnet phosphor). The garnet may be any of those materials described above with respect to the first garnet phosphor and/or the second garnet phosphor. In a preferred embodiment, the third garnet phosphor is selected from $Lu_3Al_5O_{12}$:Ce, and $Ca_3Sc_2Si_3O_{12}$:Ce.

The third garnet phosphor may be selected to adjust the emitted light from the lighting apparatus. In some embodiments, the third garnet phosphor has a third wavelength of peak emission between about 495 nm and about 540 nm. In some embodiments, the first wavelength of peak emission, the second wavelength of peak emission and the third wavelength of peak emission are substantially different (e.g., the wavelengths of peak emission are each at least about 10 nm apart).

Similar to above, the third garnet phosphor may be a different garnet from the first garnet phosphor and the second garnet phosphor. For example, the first garnet phosphor may be $Y_3Al_5O_{12}$:Ce, the second garnet phosphor may be $Lu_2CaMg_2Si_3O_{12}$:Ce and the third garnet phosphor may be $Lu_3Al_5O_{12}$:Ce. In some embodiments, the third garnet phosphor is free of at least one garnet which is present in the first garnet phosphor and at least one garnet which is present in the second garnet phosphor. As an example, the first garnet phosphor may include $Y_3Al_5O_{12}$:Ce, the second garnet phosphor may include $Lu_2CaMg_2Si_3O_{12}$:Ce, and the third garnet phosphor may have no more than trace amounts of $Y_3Al_5O_{12}$:Ce and $Lu_2CaMg_2Si_3O_{12}$:Ce. In some embodiments, the concentration of common dopant is substantially different for each of the first garnet phosphor, the second garnet phosphor and the third garnet phosphor.

The composite may optionally include one or more non-emissive layers. The diffusion or migration of dopants between layers may reduce performance of the lighting apparatus (e.g., by altering the emission spectrum), and thus a non-emissive layer may be disposed between emissive layers to reduce diffusion of dopants between the emissive layers. Thus, in some embodiments, the non-emissive layer is substantially impermeable to diffusion of the common dopant. In some embodiments, the non-emissive layer is a ceramic. As an example, the non-emissive layer may be a material selected from $Y_3Lu_3Al_5O_{12}$ and $Al_2O_3$. In some embodiments, the non-emissive layer is a garnet. For example, the non-emissive layer may be $Y_3Al_5O_{12}$ or $Lu_3Al_5O_{12}$.

The non-emissive layer exhibits insignificant emission (if any) in the visible spectrum when exposed to radiation ranging from about 360 nm to about 500 nm relative to an emissive layer. In some embodiments, the non-emissive layer consists essentially of a material selected from a garnet, $Al_2O_3$ and combinations thereof. That is, the non-emissive layer may include a garnet, $Al_2O_3$ and other materials that do not substantially alter the non-emissive property. For example, the non-emissive layer may comprise a garnet material, but not the amount of dopant effective to result in emission. In some embodiments, the non-emissive layer consists essentially of a garnet. In some embodiments, the non-emissive layer is free of dopant (e.g., no more than trace amounts of dopant).

In some embodiments, the total light transmittance of each of the emissive layers at the peak wavelength of emission, or the peak wavelength of the photoluminescent spectrum of the phosphor material, is at least about 25% of the theoretical total light transmittance, preferably at least about 40% of the theoretical total light transmittance, preferably at least about 60% of the theoretical total light transmittance. In some embodiments, the total light transmittance of each of the non-emissive layers is also at least about 60% of the theoretical total light transmittance, preferably at least about 70% of the theoretical total light transmittance, more preferably at least about 80% of the theoretical total light transmittance.

The layers of the composite, such as the emissive and non-emissive layers, may be coupled together. In some embodiments, the layers are coupled together by sintering. In some embodiments, the layers are coupled together by sintering the layers while adjacent layers are in contact. As an example, precursor materials (e.g., a mold or laminated tapes) for each layer are stacked to form an assembly. The assembly can then be sintered such that adjacent layers are fixed together. In some embodiments, the composite may be coupled together without using a resin and/or adhesive. In some embodiments, the composite is substantially free of resin and adhesive between adjacent layers. A composite is "substantially free of resin" when free of an effective amount of resin to fix the two layers together. For example, a composite having a first emissive layer and second emissive layer can be substantially free of resin between the first emissive layer and the second emissive layer. Accordingly, the amount of resin (if any) between the first emissive layer and the second emissive layer is insufficient to fix the layers together. In some embodiments, the composite is substantially free of adhesive between adjacent layers.

Figure 1A:
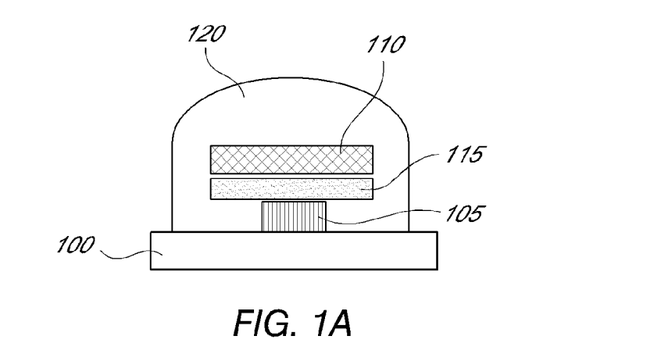
FIGS. 1A-C depict exemplary lighting apparatuses having a composite with two or more emissive layers.

FIG. 1A is an exemplary lighting apparatus having a composite with two emissive layers. A submount 100 has a light source 105 (e.g., a LED) mounted thereon. First emissive layer 110 is disposed above the second emissive layer 115 and receives at least a portion of the radiation emitted from the light source 105. Second emissive layer 115 is disposed between the conventional base LED 105 and the first emissive layer 110. The second emissive layer 115 receives at least a portion of the radiation emitted from the light source 105. An optional encapsulant resin 120 is placed over the light source 105, the first emissive layer 110 and the second emissive layer 115. In some embodiments, the first emissive layer 110 and the second emissive layer 115 are fixed together to form a composite.

Figure 1B:
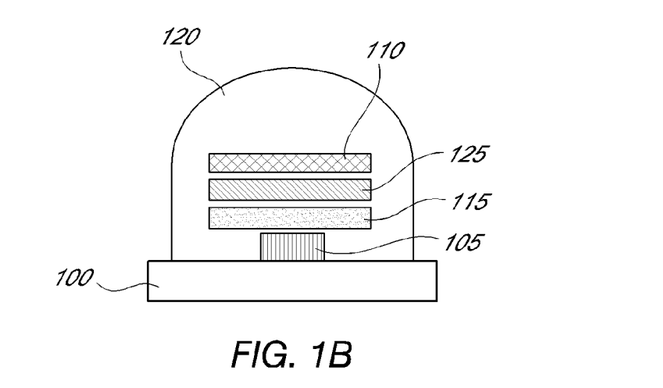

FIG. 1B is another exemplary lighting apparatus having a composite with two emissive layers and one non-emissive layer. Non-emissive layer 125 is interposed between the first emissive layer 110 and the second emissive layer 115. In an embodiment, the first emissive layer 110, the second emissive layer 115, and the non-emissive layer 125 are fixed together to form a composite.

Figure 1C:
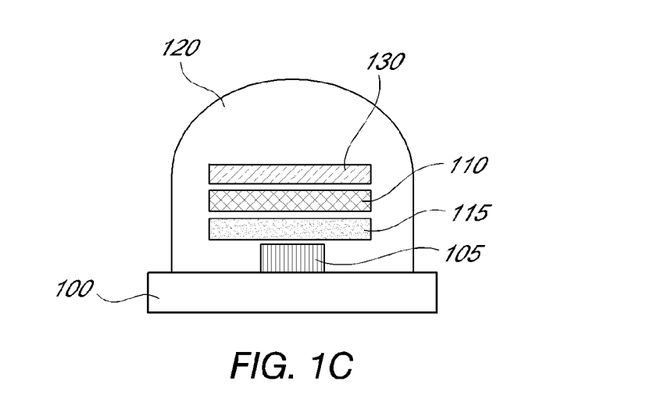

FIG. 1C is an exemplary lighting apparatus having a composite with three emissive layers. First emissive layer 110 is interposed between the second emissive layer 115 and the third emissive layer 130. The third emissive layer 130 is configured to receive at least a portion of the radiation emitted from the light source 105. In some embodiments, the first emissive layer 110, the second emissive layer 115, and the third emissive layer 130 are fixed together to form a composite.

The location of the various components (e.g., the lights source 105, first emissive layer 110, etc.) in the lighting apparatus is not particularly limited. In some embodiments, the components are configured so that both the first emissive layer and the second emissive layer receive at a least a portion of the radiation emitted from the light source. Light emitted from the second emissive layer may be reabsorbed by the first emissive layer, which can diminish the efficiency and/or CRI of the lighting apparatus. Thus, the first emissive layer and the second emissive layer may be configured to reduce emitted light from the second emissive layer that is received by the first emissive layer. In some embodiments, the second emissive layer is disposed at least partially between the light source and the first emissive layer. In some embodiments, the emission layers are configured so that there is little overlap between the emission spectrum of the second emissive layer and the excitation spectrum of the first emissive layer. By minimizing the overlap, only a small amount of light emitted from the second layer can be absorbed by the first emissive layer. As a result, the efficiency and/or CRI of the lighting apparatus is not compromised or reduced.

The phosphor compositions may be encapsulated in a mold (e.g., as illustrated by encapsulated phosphor powder 120). For example, the composition may be formed into a mold by encapsulating the first phosphor and the second phosphor in a resin, such as an epoxy or silicone. Examples and methods for encapsulating the phosphors are disclosed in U.S. Pat. Nos. 5,998,925 and 6,069,440, both of which are hereby incorporated by reference in their entirety.

By selecting appropriate emissive layers, the lighting apparatus can exhibit a CRI of at least 70 when exposed to light. In other embodiments, the CRI is at least 72; at least 75; or at least 80. The CRI refers to the ability to render various colors and has values ranging from 0 to 100, with 100 being the best. The reference correlated color temperature (CCT) for the CRI may be in the range about 2000 K to about 4000K; in the range of about 2500 K to about 3500 K; or about 2600K to about 3400 K.

Molding and Sintering to Form Composites

The lighting apparatus can include a first emissive layer having a first garnet phosphor and a second emissive layer having a second garnet phosphor (e.g., as illustrated in FIGS. 1A-C). The emissive layers may, in some embodiments, be ceramic plates. In some embodiment, the non-emissive layer can be a ceramic plate. The ceramic plates may be fixed together to form a composite.

In some embodiments, each ceramic plate independently includes a multiphasic material having about 85% to about 99.99% by volume of an emissive phase (e.g., the first garnet phosphor or the second garnet phosphor) and about 15% to about 0.01% by volume of a non-emissive phase. In some embodiments, the lighting apparatus may include a first ceramic plate having at least 85% by volume of the first phosphor, and a second ceramic plate having at least 85% by volume of the second phosphor. The ceramic plates are configured to receive at least a portion of light emitted from a light source.

Figure 2:
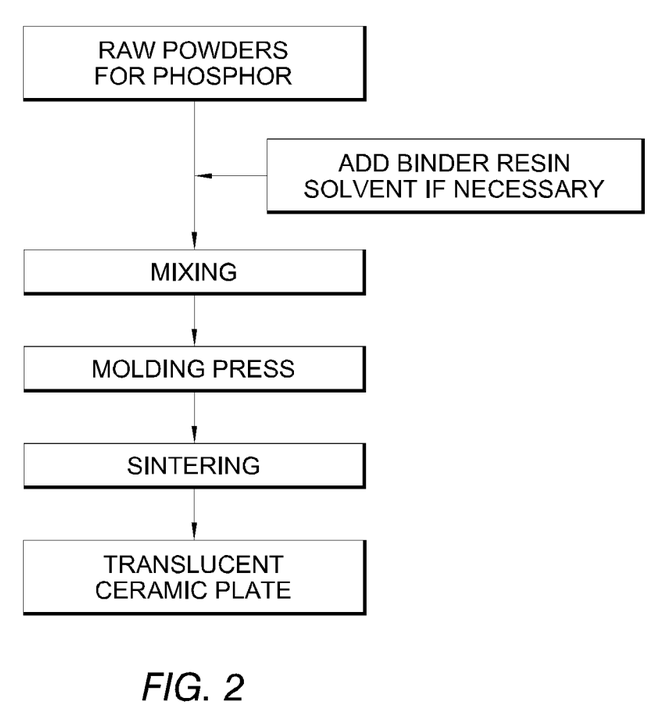
FIG. 2 shows a preparation flow diagram for one embodiment of forming the composite by molding and sintering.

The ceramic plates may be prepared by molding and sintering phosphor mixtures. Exemplary ceramic plates and methods of making the same are disclosed U.S. Publication No. 2009/0212697, which is hereby incorporated by reference in its entirety. FIG. 2 shows a preparation flow diagram for one embodiment of forming the composite by molding and sintering.

First, raw garnet phosphor powders are provided, such as the first garnet phosphor and the second garnet phosphor described herein. The raw powders may be prepared using any conventional or suitable methods, such as the flow-based thermochemical synthetic routes described herein. In some embodiments, raw powders of phosphor materials used to make the composite are typically nano-sized particles with average particle size no greater than about 1000 nm, preferably no greater than about 500 nm, more preferably no greater than 200 nm. If the particle size is greater than about 1000 nm, it can be very difficult to make total light transmittance higher than about 50%, because such large particles do not easily fuse with each other even at a high temperature and high pressure sintering condition. The result would be a tendency for a lot of air voids to remain in the ceramic plate. On the other hand, nano-sized particles can easily fuse with each other, which enable us to prepare fine and air void free ceramic plates.

The raw materials are not required to have the same composition or crystal structure of resultant phosphor ceramic plate. For example, a YAG:Ce ceramic plate may be made by using YAG:Ce powders, Y—Al—O—Ce containing amorphous powders, a mixture of YAlO$_3$:Ce and Al$_2$O$_3$ powders, a mixture of Y$_2$O$_3$, Al$_2$O$_3$, and CeO$_2$ powders, and any combination thereof.

In some embodiments, small quantities of flux materials (e.g., sintering aids) may be used in order to improve sintering properties if desired. In some embodiments, the sintering aids may include, but are not limited to, tetraethyl orthosilicate (TEOS), colloidal silica, lithium oxide, titanium oxide, zirconium oxide, magnesium oxide, barium oxide, calcium oxide, strontium oxide, boron oxide, or calcium fluoride. Additional sintering aids include, but are not limited to, alkali metal halides such as NaCl or KCl, and organic compounds such as urea. In some embodiments, the sintered ceramic plate comprises between about 0.01% and about 5%, between about 0.05% and about 5%, between about 0.1% and about 4%, or between about 0.3% and about 1% by weight of the flux material(s) or sintering aid(s). The sintering aid can be intermixed with the raw materials. For example, in some embodiments, tetraethyl orthosilicate (TEOS) can be added to the raw materials to provide the desired amount of sintering aid. In one embodiment, about 0.05% to about 5% by weight of TEOS is provided to the sintered ceramic plate. In some embodiments, the amount of TEOS may be between about 0.3% and about 1% by weight.

Various plasticizers may also be included, in some embodiments, to reduce the glass transition temperature and/or improve flexibility of the ceramic. Non-limiting examples of plasticizers include dicarboxylic/tricarboxylic ester-based plasticizers, such as bis(2-ethylhexyl) phthalate, diisononyl phthalate, bis(n-butyl)phthalate, butyl benzyl phthalate, diisodecyl phthalate, di-n-octyl phthalate, diisooctyl phthalate, diethyl phthalate, diisobutyl phthalate, and di-n-hexyl phthalate; adipate-based plasticizers, such as bis(2-ethylhexyl)adipate, dimethyl adipate, monomethyl adipate, and dioctyl adipate; sebacate-based plasticizers, such as dibutyl sebacate, and maleate; dibutyl maleate; diisobutyl maleate; polyalkylene glycols such as polyethylene glycol, polypropylene glycol, and copolymers thereof; benzoates; epoxidized vegetable oils; sulfonamides, such as N-ethyl toluene sulfonamide, N-(2-hydroxypropyl)benzene sulfonamide, and N-(n-butyl) benzene sulfonamide; organophosphates, such as tricresyl phosphate, tributyl phosphate; glycols/polyethers, such as triethylene glycol dihexanoate, tetraethylene glycol diheptanoate; alkyl citrates, such as triethyl citrate, acetyl triethyl citrate, tributyl citrate, acetyl tributyl citrate, trioctyl citrate, acetyl trioctyl citrate, trihexyl citrate, acetyl trihexyl citrate, butyryl trihexyl citrate, and trimethyl citrate; alkyl sulphonic acid phenyl ester; and mixtures thereof.

In some embodiments, the mixing and molding process may be made easier by occasionally adding binder resin and solvent to the raw powders. A binder is any substance that improves adhesion of the particles of the composition being heated to form a composite. Some non-limiting examples of binders include polyvinyl alcohol, polyvinyl acetate, polyvinyl chloride, polyvinyl butyral, polystyrene, polyethylene glycol, polyvinylpyrrolidones, polyvinyl acetates, and polyvinyl butyrates, etc. In some, but not all, circumstances, it may be useful for the binder to be sufficiently volatile that it can be completely removed or eliminated from the precursor mixture during the sintering phase. Solvents which may be used in include, but not limited to water, a lower alkanol such as but not limited to denatured ethanol, methanol, isopropyl alcohol and mixtures thereof, preferably denatured ethanol, xylenes, cyclohexanone, acetone, toluene and methyl ethyl ketone, and mixtures thereof. In a preferred embodiment, the solvent is a mixture of xylenes and ethanol.

The mixing process can be done using a mortar and pestle, ball milling machine, bead milling machine or other equivalent equipments. For the molding process, a simple die for tablet molding, hot isostatic pressing (HIP), or cold isostatic pressing (CIP) may be utilized. In some embodiments, controlled quantities of raw powders are loaded in a mold followed by applying pressure to form the plate.

Two or more molds are then stacked to form an assembly, which is subsequently sintered to form a composite. The arrangement of the molds will determine the configuration of the final composite. Thus, for example, an assembly may include a first mold having the first garnet phosphor and a second mold having the second garnet phosphor. This assembly can then be sintered to form a composite including the first emissive layer having the first phosphor and the second emissive layer having the second phosphor. As an example, a composite including the first emissive layer 110 and the second emissive 115, as illustrated in FIG. 1A. Accordingly, a person of ordinary skill, guided by the teachings of the present application, can prepare various composite configurations, such as those disclosed above, by appropriately stacking the molds prior to sintering.

As disclosed above, non-emissive layers may also be included in the composite. A non-emissive layer may be prepared, for example, by preparing a mold of YAG powder that excludes amounts of dopant that are effective to produce fluorescence. The mold may be included in the stacked assembly that is subsequently sintered to form the composite.

The assembly is then sintered at a high temperature that does not exceed the melting point of the resultant phosphor materials. Thus, by sintering the assembly having two or more molds, a single sintering process is used to prepare a composite having two or more emissive layers. The emissive layers in the composite, in some embodiments, are coupled together upon completion of the sintering process. In some embodiments, the composite is fixed together upon completion of the sintering process.

Any kinds of suitable ceramic sintering techniques can be used to prepare translucent ceramic plates. In some embodiments, sintering may be carried out while applying pressure. Sintering conditions such as the temperature profile, atmosphere, pressure, and duration depend on the type of phosphor material.

Laminating and Sintering to Form Composites

Figure 3:
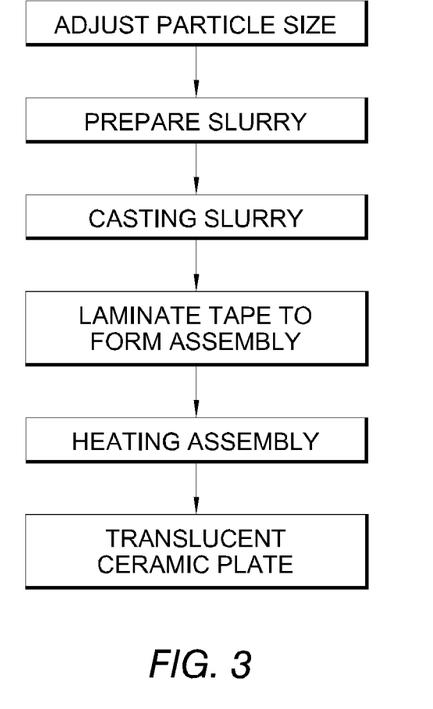
FIG. 3 shows a preparation flow diagram for one embodiment of forming the composite by laminating and sintering.

The composite may be formed by laminating and sintering two or more cast tapes, where the cast tapes can include the first phosphor and/or the second phosphor. Examples and methods of laminating and sintering two or more cast tapes are disclosed in U.S. Pat. No. 7,514,721 and U.S. Publication No. 2009/0108507, both of which are hereby incorporated by reference in their entirety. FIG. 3 shows a preparation flow diagram for one embodiment of forming the ceramic plate by laminating and sintering.

First, the particle size of the raw materials (e.g., nitrate or oxide based raw materials, such as $Y_2O_3$ and $Al_2O_3$ for forming YAG) may optionally be adjusted to reduce cracking in the cast tapes from capillary forces during evaporation of solvents. For example, the particle size can be adjusted by pre-annealing raw material particles to obtain the desired particle size. Raw material particles can be pre-annealed in the temperature range of about 800° C. to about 1800° C. (or more preferably 1000° C. to about 1500° C.) to obtain the desired particle size. The pre-annealing may occur in a vacuum, air, $O_2$, $H_2$, $H_2/N_2$, or a noble gas (e.g., He, Ar, Kr, Xe, Rn, or combinations thereof). In an embodiment, each of the raw materials (e.g., $Y_2O_3$ and $Al_2O_3$ for forming YAG) is adjusted to be about the same particle size. In another embodiment, the particles have a BET surface area in the range of about 0.5 $m^2/g$ to about 20 $m^2/g$ (preferably about 1.0 $m^2/g$ to about 10 $m^2/g$, or more preferably about 3.0 $m^2/g$ to about 6.0 $m^2/g$).

A slurry may then be prepared for subsequently casting into a tape. Pre-made phosphors (e.g., phosphors prepared by flow-based thermochemical synthetic routes described herein) and/or stoichiometric amounts of raw materials can be intermixed with various components to form a mixture. Exemplary components for the mixture include, but are not limited to, dopants, dispersants, plasticizers, binders, sintering aids and solvents. The dopants, sintering aids, plasticizers, binders and solvents may be the same as those described above with respect to the molding and sintering process.

In some embodiments, the dispersants can be Flowen, fish oil, long chain polymers, steric acid, oxidized Menhaden fish oil, dicarboxylic acids such succinic acid, orbitan monooleate, ethanedioic acid, propanedioic acid, pentanedioic acid, hexanedioic acid, heptanedioic acid, octanedioic acid, nonanedioic acid, decanedioic acid, o-phthalic acid, p-phthalic acid and mixtures thereof.

The mixture may then be subjected to comminution to form a slurry by, for example, ball milling the mixture for a time period in the range of about 0.5 hrs. to about 100 hrs. (preferably about 6 hrs. to about 48 hrs., or more preferably about 12 hrs. to about 24 hrs.). The ball milling may utilize milling balls that include materials other than the components intermixed within the mixture (e.g., the milling balls may be $ZnO_2$ for a mixture that forms YAG). In an embodiment, the ball milling includes isolating the milling balls after a period of time by filtration or other known methods of isolation. In some embodiments, the slurry has a viscosity in the range of about 10 cP to about 5000 cP (preferably about 100 cP to about 3000 cP, or more preferably about 400 cP to 1000 cP).

Third, the slurry may be cast on a releasing substrate (e.g., a silicone coated polyethylene teraphthalate substrate) to form a tape. For example, the slurry may be cast onto a moving carrier using a doctor blade and dried to form a tape. The thickness of the cast tape can be adjusted by changing the gap between the doctor blade and the moving carrier. In some embodiments, the gap between the doctor blade and the moving carrier is in the range of about 0.125 mm to about 1.25 mm (preferably about 0.25 mm to about 1.00 mm, or more preferably about 0.375 mm to about 0.75 mm). Meanwhile, the speed of the moving carrier can have a rate in the range of about 10 cm/min. to about 150 cm/min. (preferably about 30 cm/min. to about 100 cm/min., or more preferably about 40 cm/min. to about 60 cm/min.). By adjusting the moving carrier speed and the gap between the doctor blade and moving carrier, the tape can have a thickness between about 20 μm and about 300 μm. The tapes may optionally be cut into desired shapes after casting.

Two or more tapes are laminated to form an assembly. The lamination step can include stacking two or more tapes (e.g., 2 to 100 tapes are stacked) and subjecting the stacked tapes to heat and uniaxial pressure (e.g., pressure perpendicular to the tape surface). For example, the stacked tapes may be heated above the glass transition temperature ($T_g$) of the binder contained in the tape and compressed uniaxially using metal dies. In some embodiments, the uniaxial pressure is in the range of about 1 to about 500 MPa (preferably about 30 MPa to about 60 MPa). In some embodiments, the heat and pressure is applied for a time period in the range of about 1 min. to about 60 min. (preferably about 15 min. to about 45 min., or more preferably about 30 min.). The lamination step may optionally include forming various shapes (e.g., holes or pillars) or patterns into the assembly by, for example, using shaped dies.

Some embodiments of the assembly include at least one tape having the first garnet phosphor and at least one tape having the second garnet phosphor. The arrangement of the stacked tapes is not particularly limited, however the tapes may be stacked so all of the tapes including the first phosphor are stacked together and all of the tapes including the second phosphor are stacked together. Similar to the discussion above with regard to the stacking of molds to form the assembly, the configuration of the stacked tapes will correspond with the configuration of the composite.

The assembly may be heated to form the composite. The heating step may include a debinding process and a sintering process. The debinding process includes decomposing at least a portion of organic components within the assembly (e.g., volatilize binders and plasticizers within the assembly). As an example, the assembly may be heated in air to a temperature in the range of about 300° C. to about 1200° C. (preferably about 500° C. to about 1000° C., or more preferably about 800° C.) at a rate of about 0.1° C./min. to about 10° C./min. (preferably about 0.3° C./min. to about 5° C./min., or more preferably about 0.5° C./min. to about 1.5° C./min). The exemplary heating step may also include maintaining the temperature for a time period in the range of about 30 min. to about 300 min., which may be selected based upon the thickness of the assembly.

The heating step also includes a sintering process to form the composite. The assembly may be sintered in a vacuum, air, $O_2$, $H_2$, $H_2/N_2$, or a noble gas (e.g., He, Ar, Kr, Xe, Rn, or combinations thereof) at a temperature in the range of about 1200° C. to about 1900° C. (preferably about 1300° C. to about 1800° C., or more preferably about 1350° C. to about 1700° C.) for a time period in the range of about 1 hr. to about 100 hrs (preferably about 2 hrs. to about 10 hrs.). In some embodiments, the debinding and sintering processes are completed in a single step.

The assembly may be sandwiched between cover plates during the heating step to reduce distortion (e.g., warping, cambering, bending, etc.) of the assembly. The cover plates may include materials having a melting point above the temperatures applied during the heating step. Moreover, the cover plate may be sufficiently porous to permit transport of volatilized components through the covering plates. As an example, the covering plate may be zirconium dioxide having a porosity of about 40%.

An optional reoxidation step may also be included to improve the transmittance of the composite. Reoxidation can include exposing the composite to oxygen or air at a temperature in the range of about 1000° C. to about 1500° C. (preferably about 1400° C.) for a time period of about 30 min. to about 300 min. (preferably about 2 hrs.) at a heating rate of about 1° C./min. to about 20° C./min. (preferably about 5° C./min.).

The lighting apparatus may include non-emissive layers (e.g., non-emissive layer 125 illustrated in FIG. 1B). The non-emissive layer can be a ceramic plate which may also be prepared using similar laminating and sintering procedures as those described above. A non-emissive layer may be prepared, for example, by laminating and sintering a YAG powder into the assembly that excludes amounts of dopant that are effective to produce fluorescence.

EXAMPLES

Additional embodiments are disclosed in further detail in the following examples, which are not in any way intended to limit the scope of the claims.

Example 1

Warm White Light Emitting Composite

The following example demonstrates forming a composite for the emission of warm white light.

Example 1.1

YAG: Ce 0.14923 mol (14.29 g) of Yttrium (III) nitrate hexahydrate (99.9% pure, Sigma-Aldrich), 0.25 mol (23.45 g) of Aluminum nitrate nonahydrate (99.97% pure, Sigma-Aldrich), and 0.015 mol (0.081 g) of Cerium (III) nitrate hexahydrate (99.99% pure, Sigma-Aldrich) were dissolved in 250 ml of deionized water, followed by ultrasonication for 30 min to prepare the transparent precursor solution. This precursor solution of 0.4 M was carried into a plasma reaction chamber via an atomization probe using a liquid pump.

All deposition experiments were conducted with an RF induction plasma torch (TEKNA Plasma System, Inc PL-35) operating at 3.3 MHz. For the deposition experiments, the chamber pressure was kept at around 25 kPa-35 kPa, and the RF generator plate power was in the range of 10-12 kW. Both the plate power and the deposition pressure are user-controlled parameters. Argon was introduced into the plasma torch as both the swirling sheath gas and the central plasma gas via the gas inlet ports. Sheath gas flow was maintained at 30 slm (standard liters per minute), while central gas flow was 10 slm.

Reactant injection was performed using a radial atomization probe (TEKNA Plasma System, Inc SDR-772). The probe was positioned at the center of the plasma plume during reactant injection. The reactants were fed into the plasma plume at a rate of 10 ml/min during deposition. Atomization of the liquid reactant was performed with Argon as atomizing gas delivered at a flow rate of 15 slm. The cooling water supply to the atomization probe was maintained at a flow rate of 4 slm and at a pressure of 1.2 MPa, as recommended by the manufacturer.

Crystalline phases of the deposited particles were investigated using X-ray diffraction (XRD) spectra obtained with a Bruker AXS micro-difftactometer (CuKa). The crystalline phase of the obtained sample was identified as a mixture of amorphous and yttrium aluminum perovskite (YAP). The average particle diameter ($D_{avg}$) was obtained from BET surface area based on data acquired from a Micrometritics model Gemini 2365 gas sorptometer. The obtained $D_{avg}$ of the sample was 75 nm.

Example 1.2

$Lu_2Mg_2Si_3O_{12}$:Ce

The procedure of Example 1.1 was followed except that 52.612 g of Lutetium nitrate hydrate (46.8% pure, Metall Rare Earth Limited, ShenZhen, P. R. China), 14.899 g of Calcium nitrate tetrahydrate (99% pure, Sigma-Aldrich), 32.374 g of Magnesium nitrate hexahydrate (99% pure, Fluka), 102.908 g of Aminopropylsilanetriol (25% in water, Gelest), and 0.543 g of Cerium (III) nitrate hexahydrate (99.99% pure, Sigma-Aldrich) were dissolved in 250 ml of deionized water, followed by ultrasonication for 30 min to prepare the transparent precursor solution. This precursor solution of 0.4 M was carried into a plasma reaction chamber via an atomization probe using a liquid pump.

Example 1.3

Preparation of Non-Emissive (Undoped) Material

The preparation of the non-emissive material was prepared similarly to that described above, except that no Cerium (III) nitrate hexahydrate was added to 0.14923 mol (14.29 g) of Yttrium (III) nitrate hexahydrate (99.9% pure, Sigma-Aldrich), 0.25 mol (23.45 g) of Aluminum nitrate nonahydrate (99.97% pure, Sigma-Aldrich).

Example 1.4

Preparation of Sintered Ceramic Plates of YAG:Ce Phosphor Material

Sintered ceramic plates were made using YAG:Ce phosphor nano-powders. 4 g of nano-powder prepared by the method described above, 0.21 g of poly(vinyl butyral-co-vinyl alcohol-co-vinyl acetate) (average Mw 90,000-120,000 powder, Sigma-Aldrich), 0.012 g of fumed silica powder (CAB-O-SIL® HS-5, Cabot Corporation), and 10 ml of ethanol were well mixed by mortar and pestle until the mixture slurry solution became very smooth. By blowing hot air from a dryer and keeping the pestle moving, ethanol was completely removed, and dry powders were obtained. Then 120 mg of the dry powders were spread out into a 3 mm diameter die (Product#: 0012-6646, 3 mm KBr Die Set, International Crystal Laboratories, Inc), followed by applying a pressure of 4000 psi using hydraulic press. Then the obtained plates were sintered at 800° C. for 2 hrs (heating rate of 2° C./min) using a box electrical furnace under an air ambient, and then at 1500° C. for 5 hrs (heating rate is 5° C./min) using tube electrical furnace under vacuum. The crystalline phase of all ceramic plate samples was determined as yttrium aluminum garnet by XRD.

Example 1.5

Preparation of Sintered Ceramic Plates of $Lu_2CaMg_2Si_3O_{12}$:Ce Phosphor Material The procedure of Example 1.4 was followed except that 4 g of $Lu_2CaMg_2Si_3O_{12}$:Ce, as prepared in Example 1.2, and the obtained plates were sintered at 1400° C. for 5 hrs under vacuum.

Example 2

Laminated Composite of Emissive Layers

The following example demonstrates the emission of warm white light by a composite formed by lamination.

Example 2.1

Non-Emissive Layers for Laminated Composite

A 50 ml high purity $Al_2O_3$ ball mill jar was filled with 55 g of $Y_2O_3$-stabilized $ZrO_2$ ball of 3 mm diameter. Then, in a 20 ml glass vial, 0.153 g dispersant (Flowlen G-700. Kyoeisha), 2 ml xylene (Fisher Scientific, Laboratory grade) and 2 ml ethanol (Fisher Scientific, reagent alcohol) were mixed until the dispersant was dissolved completely. The dispersant solution and tetraethoxysilane as sintering aid (0.038 g, Fluka) were added to a ball mill jar.

$Y_2O_3$ powder (3.984 g, 99.99%, lot N-YT4CP, Nippon Yttrium Company Ltd.) with a BET surface area of 4.6 $m^2$/g and $Al_2O_3$ powder (2.998 g, 99.99%, grade AKP-30, Sumitomo Chemicals Company Ltd.) with a BET surface area of 6.6 $m^2$/g were added to ball mill jar. The total powder weight was 7.0 g and the ratio of $Y_2O_3$ to $Al_2O_3$ was at a stoichiometric ratio of 3:5. A first slurry was produced by mixing the $Y_2O_3$ powder, the $Al_2O_3$ powder, dispersant, tetraethoxysilane, xylenes, and ethanol by ball milling for 24 hours.

A solution of binder and plasticizers was prepared by dissolving 3.5 g poly(vinyl butyral-co-vinyl alcohol-co-vinyl acetate) (Aldrich), 1.8 g benzyl n-butyl phthalate (98%, Alfa Aesar), and 1.8 g polyethylene glycol (Mn=400, Aldrich) in 12 ml xylene (Fisher Scientific, Laboratory grade) and 12 ml ethanol (Fisher Scientific, reagent alcohol). A second slurry was produced by adding 4 g of the binder solution into the first slurry and then milling for another 24 hours. When ball milling was complete, the second slurry was passed through a syringe-aided metal screen filter with pore size of 0.05 mm. Viscosity of second slurry was adjusted to 400 centipoise (cP) by evaporating solvents in the slurry while stirring at room temperature. The slurry was then cast on a releasing substrate, e.g., silicone coated Mylar® carrier substrate (Tape Casting Warehouse) with an adjustable film applicator (Paul N. Gardner Company, Inc.) at a cast rate of 30 cm/min. The blade gap on the film applicator was set at 0.508 mm (20 mil). The cast tape was dried overnight at ambient atmosphere to produce a green sheet of about 140 μm thickness.

Example 2.2

YAG: Ce Layers

Plasma-produced yttrium aluminum oxide (with stoichiometry Y:Al:O=3:5:12) powders (5.2 g) containing 0.2 mol % cerium with respect to yttrium with a BET surface area of about 20 $m^2$/g was added to a high purity alumina combustion boat followed by annealing in a tube furnace (MTI GSL-1600) at heating ramp of 3-5° C./min to 1250° C. in air or 3% $H_2$/97% $N_2$ for 2 hrs. Then, it was cooled down to room temperature at a ramp of 5° C./min. Yellow color powder with a BET surface area of 4.6 $m^2$/g was obtained after annealing.

A 50 ml high purity $Al_2O_3$ ball mill jar was filled with 24 g $Y_2O_3$ stabilized $ZrO_2$ ball of 3 mm diameter. Then, in a 20 ml glass vial, 0.084 g dispersant (Flowlen G-700. Kyoeisha), 2 ml xylene (Fisher Scientific, Laboratory grade), and 2 ml ethanol (Fisher Scientific, reagent alcohol) were mixed until the dispersant was dissolved completely. The dispersant solution and tetraethoxysilane as a sintering aid (0.045 g 99.0% pure, Fluka) were added to a ball mill jar. The annealed plasma YAG powder (3.0 g) with a BET surface area of 4.6 $m^2$/g, was added to a ball mill jar. The first slurry was produced by mixing the YAG powder, dispersant, tetraethoxysilane, xylenes, and ethanol by ball milling for 24 hours.

A solution of binder and plasticizers was prepared by dissolving 5.25 g poly(vinyl butyral-co-vinyl alcohol-co-vinyl acetate) (Aldrich), 2.6 g benzyl n-butyl phthalate (98%, Alfa Aesar), and 2.6 g polyethylene glycol (Mn=400, Aldrich) in 18 ml xylene (Fisher Scientific, Laboratory grade) and 18 ml ethanol (Fisher Scientific, reagent alcohol). A second slurry was produced by adding 1.2 g of the binder solution into the first slurry and then milling another 24 hours. When ball milling was complete, the second slurry was passed through a syringe-aided metal screen filter with pore size of 0.05 mm. The viscosity of the second slurry was adjusted to 400 centipoise (cP) by evaporating solvents in the slurry while being stirred at room temperature. The slurry was then cast on a releasing substrate, e.g., silicone coated Mylar® carrier substrate (Tape Casting Warehouse) with an adjustable film applicator (Paul N. Gardner Company, Inc.) at a cast rate of 30 cm/min. The blade gap on the film applicator was set at 0.508 mm (20 mil). The cast tape was dried overnight at ambient atmosphere to produce a yellow-colored green sheet of about 140 μm thickness.

Example 2.3

$Lu_2CaMg_2Si_3O_{12}$:Ce

The procedure of Example 2.2 was followed except that 3.0 g of $Lu_2CaMg_2Si_3O_{12}$:Ce, which contained 1 mol % cerium with respect to lutetium, as prepared in Example 1.2, were used instead of YAG:Ce powder.

Example 2.4

Laminating Layers

The dried cast tape of the first phosphor material (300 μm thickness) comprising the annealed plasma YAG:Ce powders, the dried cast tape of the non-emissive material (100 μm thickness) comprising YAG with no Ce powder, as well as the dried cast tape comprising the annealed plasma $Lu_2CaMg_2Si_3O_{12}$:Ce powders (250 μm thickness) were cut into circular shapes of 13 mm diameter with a metal puncher. The respective pieces of punched circular-shaped tapes were placed between circular dies with mirror-polished surfaces and heated on a hot plate to 80° C., and subsequently compressed in a hydraulic press at a uniaxial pressure of 5 metric tons for 5 minutes. Laminated composites of emissive (first phosphor material and second phosphor material) and non-emissive layers were thus produced.

For debinding, laminated green sheets were sandwiched between $ZrO_2$ cover plates (1 mm in thickness, grade 42510-X, ESL Electroscience Inc.) and placed on an $Al_2O_3$ plate of 5 mm thickness. The sandwiched laminate was then heated in a tube furnace in air at a ramp rate of 0.5° C./min to 800° C. and held for 2 hours to remove the organic components from the green sheets to generate a preform.

After debinding, the preforms were annealed at 1500° C. in a vacuum of $10^{-1}$ Torr for 5 hours at a heating rate of 1° C./min to complete conversion from non-garnet phases of Y—Al—O in the non-emissive layer, including, but not limited to, amorphous yttrium oxides, YAP, YAM or $Y_2O_3$ and $Al_2O_3$ to yttrium aluminum garnet (YAG) phase, and the conversion from amorphous $Lu_2CaMg_2Si_3O_{12}$:Ce to crystallized $Lu_2CaMg_2Si_3O_{12}$:Ce phase as well as increase the final YAG and $Lu_2CaMg_2Si_3O_{12}$:Ce grain size.

Following the first annealing, the preforms were further sintered in a vacuum of $10^{-3}$ Torr at about 1650° C. for 2 hours at a heating rate of 5° C./min and a cooling rate of 10° C./min to room temperature to produce a translucent YAG/YAG:Ce/$Lu_2CaMg_2Si_3O_{12}$:Ce/YAG ceramic sheet of about 0.60 mm thickness. When the laminated green sheets were annealed in the furnace with a graphite heater and carbon felt lining, the preforms were embedded in sacrificial undoped YAG powders of 1 to 5 μm particle size to prevent the samples from being partially reduced to constituent metals due to strong reducing atmosphere. Brownish sintered ceramic sheets were reoxidized in a furnace under vacuum at 1400° C. for 2 hrs at heating and cooling rates of 10° C./min and 20° C./min respectively.

Example 2.5

Optical Measurements

Chromaticity measurements were performed with Otsuka Electronics MCPD 7000 multi channel photo detector system together with required optical components such as optical fibers (Otuka Electronics), 12-inch diameter integrating spheres (Gamma Scientific, GS0IS12-TLS, calibration light source (Gamma Scientific, GS-IS12-OP1) configured for total flux measurement, and excitation light source (Cree blue-LED chip, dominant wavelength 455 nm, C455EZ1000-S2001).

A blue LED with a peak wavelength of 455 nm was then placed at the central position of the integrating sphere and was operated with a drive current of 25 mA. First the radiation power from the bare blue LED chip as excitation light was acquired. The light emitting face distance of LED chip was 1 mm. A diced 2 mm×2 mm laminated sample was coated with paraffin oil having similar refractive index as common encapsulation resin such as epoxy (for example about 1.75) was then mounted a distance of about 100 μm from LED chip. The radiation power of the combination of the composite laminate and the blue LED was then acquired.

Figure 4:
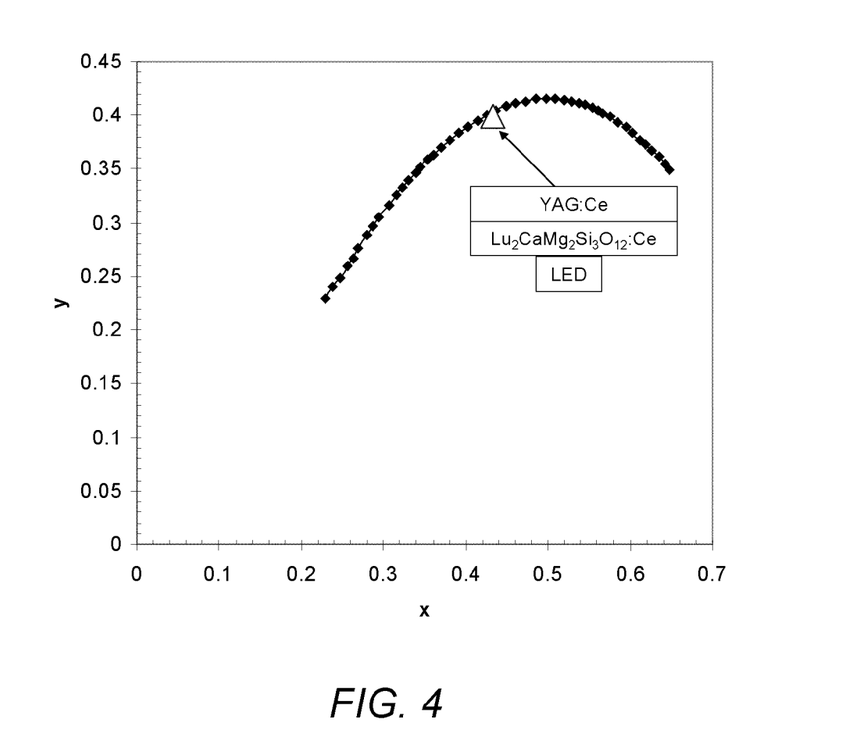
FIG. 4 shows the chromaticity of an exemplary YAG:Ce/Lul:Ce laminated composite excited by a blue emitting LED.
Figure 5:
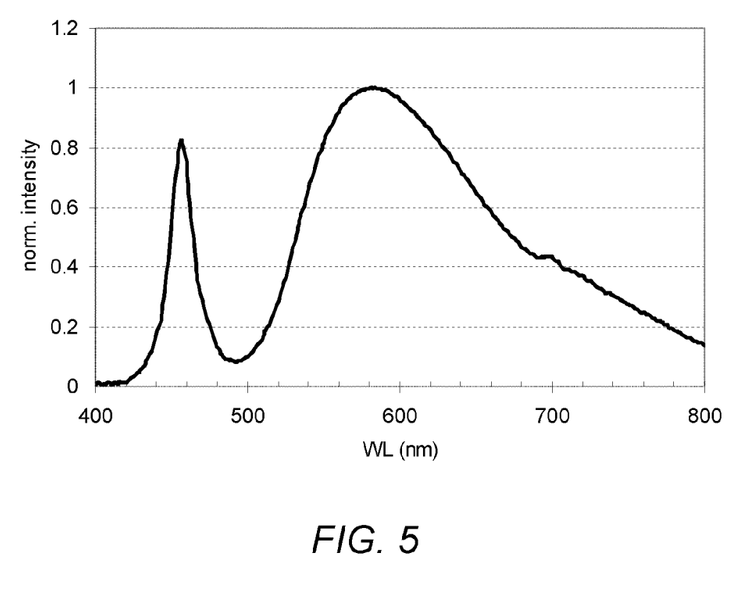
FIG. 5 shows the emission spectrum of an exemplary YAG:Ce/Lul:Ce laminated composite excited by a blue emitting LED.

As shown in FIG. 4, the composite YAG:Ce and Lu1 laminate, which was prepared according to Examples 2.1-2.5, had CIE coordinates with Cy of about 0.3986±0.0025 and Cx of about 0.4328±0.0025, indicating a white light having a CT of about 3025K ("warm white"). The resultant composite exhibited a CRI of about 70. Meanwhile, FIG. 5 shows the emission spectrum the same YAG:Ce and Lu1 laminate by a blue LED with a peak wavelength of 455 nm.

What is claimed is:

1. A lighting apparatus comprising:
   a light source configured to emit radiation having a wavelength of peak emission between about 360 nm and about 500 nm; and
   a composite configured to receive at least a portion of the radiation emitted by the light source, wherein the composite comprises a first emissive layer and a second emissive layer that are sintered together;
      wherein the first emissive layer comprises a first garnet phosphor and the second emissive layer comprises a second garnet phosphor, and the first garnet phosphor and the second garnet phosphor are doped with a common dopant.

2. The lighting apparatus of claim 1, wherein the second emissive layer is disposed between the first emissive layer and the light source.

3. The lighting apparatus of claim 1, wherein the composite is substantially free of resin between the first emissive layer and the second emissive layer.

4. The lighting apparatus of claim 1, wherein the composite is substantially free of an adhesive between the first emissive layer and the second emissive layer.

5. The lighting apparatus of claim 1, wherein each of the first emissive layer and the second emissive layer has an at least 25% transmittance.

6. The lighting apparatus of claim 1, wherein the first garnet phosphor has a first wavelength of peak emission between about 495 nm and about 560 nm.

7. The lighting apparatus of claim 1, wherein the second garnet phosphor has a second wavelength of peak emission between about 570 nm and about 650 nm.

8. The lighting apparatus of claim 1, wherein the first garnet phosphor is doped with the common dopant at a concentration in the range of about 0.05% to about 10.00% by mol.

9. The lighting apparatus of claim 1, wherein the second garnet phosphor is doped with the common dopant at a concentration in the range of about 0.05% to about 10.00% by mol.

10. The lighting apparatus of claim 1, wherein the common dopant is selected from the group consisting of Nd, Er, Eu, Cr, Yb, Sm, Tb, Ce and Pr.

11. The lighting emitting apparatus of claim 1, wherein the first garnet phosphor is selected from the group consisting of $Lu_3Al_5O_{12}$:Ce, $Ca_3Sc_2Si_3O_{12}$:Ce, $Y_3Al_5O_{12}$:Ce, $(Y,Tb)_3Al_5O_{12}$:Ce and $(Y, Gd)_3(Al, Ga)_5O_{12}$:Ce.

12. The lighting emitting apparatus of claim 11, wherein the second garnet phosphor is $Lu_2CaMg_2Si_3O_{12}$:Ce.

13. The lighting emitting apparatus of claim 11, wherein the first garnet phosphor is $Lu_3Al_5O_{12}$:Ce, and the second garnet phosphor is $Y_3Al_5O_{12}$:Ce.

14. The lighting apparatus of claim 1, wherein the first emissive layer and the second emissive layer are ceramic plates or laminated ceramic tapes.

15. The lighting apparatus of claim 1, wherein the composite further comprises a third emissive layer, wherein the third emissive layer comprises a third garnet phosphor having a third wavelength of peak emission.

16. The lighting apparatus of claim 15, wherein the third wavelength of peak emission is between about 495 nm and about 540 nm, the first wavelength of peak emission is between about 540 and about 590 nm, and the second wavelength of peak emission is between 570 nm and about 650 nm.

17. The lighting apparatus of claim 15, wherein the first emissive layer is disposed between the third emissive layer and the second emissive layer.

18. The lighting apparatus of claim 15, wherein the first garnet phosphor is selected from the group consisting of $Lu_3Al_5O_{12}$:Ce and $Ca_3Sc_2Si_3O_{12}$:Ce, and the third garnet phosphor is selected from the group consisting of $Y_3Al_5O_{12}$:Ce, $(Y,Tb)_3Al_5O_{12}$:Ce. and $(Y, Gd)_3(Al, Ga)_5O_{12}$:Ce.

19. The lighting emitting apparatus of claim 15, wherein the second garnet phosphor is $Lu_2CaMg_2Si_3O_{12}$:Ce.

20. The lighting apparatus of claim 1, wherein the composite further comprises a first non-emissive layer disposed between the first emissive layer and the second emissive layer, wherein the first non-emissive layer is substantially transparent.

21. A method of making a composite comprising:
providing an assembly comprising a first layer and a second layer, wherein the first layer comprises a first doped garnet phosphor, and the second layer comprises a second doped garnet phosphor, wherein the first doped garnet phosphor and the second doped garnet phosphor have a common dopant; and
sintering the assembly to produce the composite.

* * * * *